Figure 1:
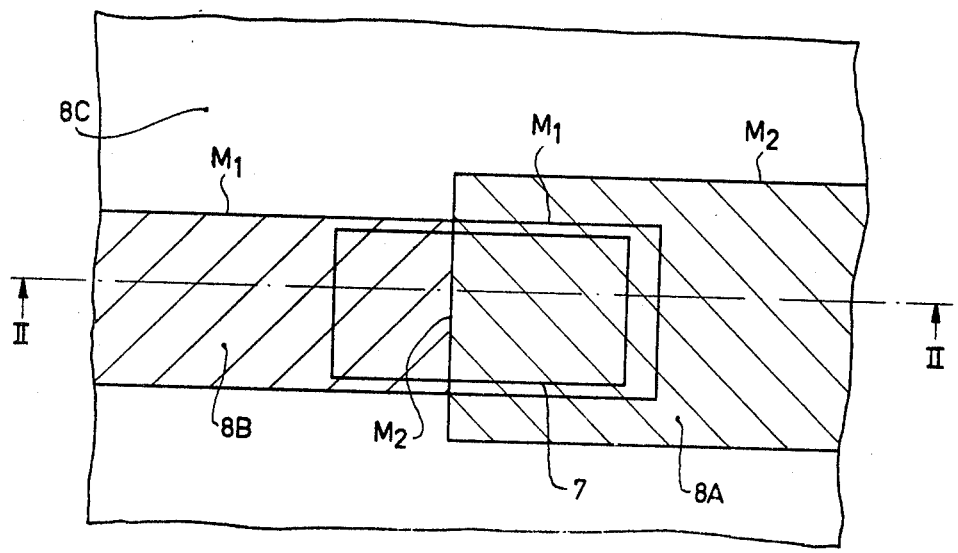

United States Patent [19]
Slob

[11] 4,283,837
[45] Aug. 18, 1981

[54] SEMICONDUCTOR DEVICE AND METHOD OF MANUFACTURING SAME

[75] Inventor: Arie Slob, Eindhoven, Netherlands

[73] Assignee: U.S. Philips Corporation, New York, N.Y.

[21] Appl. No.: 29,424

[22] Filed: Apr. 12, 1979

Related U.S. Application Data

[62] Division of Ser. No. 837,032, Sep. 27, 1977, Pat. No. 4,161,745.

[30] Foreign Application Priority Data

Nov. 19, 1976 [NL] Netherlands ........................ 7612883

[51] Int. Cl.³ .................. H01L 21/365; H01L 21/42; H01L 21/44
[52] U.S. Cl. ...................................... 29/578; 148/1.5; 148/175; 148/188
[58] Field of Search ................... 29/578; 148/1.5, 188, 148/175; 357/59

[56] References Cited
U.S. PATENT DOCUMENTS

| | | | |
|---|---|---|---|
| 3,212,162 | 10/1965 | Moore | 29/578 |
| 3,764,413 | 11/1971 | Kakizaki et al. | 148/188 |
| 3,825,997 | 7/1974 | Wakamiya | 29/578 |
| 3,933,529 | 1/1976 | Goser | 148/1.5 |
| 3,959,025 | 5/1976 | Polinsky | 148/1.5 |

*Primary Examiner*—Donald L. Walton
*Attorney, Agent, or Firm*—Thomas A. Briody; Robert T. Mayer; Steven R. Biren

[57] ABSTRACT

A semiconductor device includes a silicon substrate having an insulating layer with a window. A silicon layer is deposited on the insulating layer and on the silicon substrate surface in the window. This silicon layer has n-type and p-type conductive layer parts which adjoin each other within the window and which each serve as both a connection conductor and an electrode of an active zone of the device. Semiconductor devices in accordance with the invention feature very small surface areas, and are thus particularly suitable for high frequency operation.

8 Claims, 19 Drawing Figures

SEMICONDUCTOR DEVICE AND METHOD OF MANUFACTURING SAME

This is a division of application Ser. No. 837,032, filed Sept. 27, 1977, now U.S. Pat. No. 4,161,745.

The invention relates to a semiconductor device having a semiconductor body of monocrystalline silicon, which device comprises at least one semiconductor circuit element in which a surface of the semiconductor body is provided with an electrically insulating layer having at least one window and a silicon layer which extends on the insulating layer and on the silicon surface within the window and which comprises a first part of a first conductivity type and a second part of the second conductivity type adjoining same at least within the window.

The invention furthermore relates to a method of manufacturing the device.

A semiconductor device as described above is disclosed, for example, in U.S. Pat. No. 3,600,651. In said device, at least a zone of a semiconductor circuit element is formed in a part of the silicon layer situated within the window, a part of the silicon layer of the same conductivity type as the zone being used as a connection conductor to the zone. The connections to other zones of the other conductivity type belonging to the semiconductor element are effected either via a metallization, or via the substrate.

An important drawback of this known semiconductor device is that the capacitances present as a result of the use of the said metallization are comparatively large. For providing the metallization on a given zone, said zone should, as a matter of fact, have a certain minimum size. The surface of the zones and of the associated p-n junctions of the semiconductor circuit elements, and hence also the corresponding capacitances, are often inadmissibly high for use at very high frequency, also in connection with the alignment tolerances to be observed.

One of the objects of the invention is to provide a semiconductor device having a minimum surface area and hence a minimum of stray capacitances, which semiconductor device can moreover be manufactured without narrow alignment tolerances.

Another object of the invention is to provide a method by means of which the device described can be manufactured with a minimum of process steps.

Still another object of the invention is to provide a bipolar transistor for use at very high frequencies, in which at least two of the three active zones are not contacted by means of metal layers.

The invention is based inter alia on the recognition that the end in view can be achieved by an efficacious use of the said silicon layer in the pattern of connection conductors and electrodes of the semiconductor circuit element.

According to the invention, a semiconductor device of the kind described is therefore characterized in that the first part of the silicon layer within the window forms the electrode and outside the window on the insulating layer forms the connection conductor of a first active zone of the first conductivity type, and that the second part of the silicon layer within the window forms the electrode and outside the window on the insulating layer forms the connection conductor of a second active zone of the second conductivity type of the semiconductor circuit element.

By using parts of the silicon layer adjoining each other as an electrode and connection conductor of both p-type and n-type zones, the surface of the semiconductor circuit element and hence also the stray capacitances, are minimized. As a result of this, semiconductor circuit elements can be obtained for use at very high frequencies which may be used very advantageously both as discrete elements and in integrated circuits.

According to a simple embodiment which can easily be manufactured, the silicon layer consists entirely of polycrystalline material both inside and outside the window.

In certain circumstances, however, the fact that the resulting p-n junction between the first and the second part of the silicon layer is situated entirely in polycrystalline material might be disadvantageous, for example, due to the occurrence of too high leakage currents. According to another preferred embodiment the silicon layer therefore consists within the window of monocrystalline material grown epitaxially on the silicon surface, and outside the window it consists of polycrystalline material, as in the above-mentioned U.S. Pat. No. 3,600,651.

Although the first and second active zones may be present entirely in the silicon layer, the second active zone preferably is a zone of the silicon body adjoining the surface within the window and forming a p-n junction with the adjoining part of the semiconductor body. As a result of this, structures can be realized having active zones situated vertically above each other, for example vertical bipolar transistors. In order to restrict the required surface area as much as possible and to enable manufacture with a minimum of masking steps, the second active zone is advantageously provided so as to be practically bounded by the edge of the window (except for possible lateral diffusion). The second active zone is preferably determined entirely by the window, that is to say is formed entirely by doping while using the window as a masking.

Although other semiconductor circuit elements according to the invention may also be constructed, according to a very important embodiment the second active zone is situated between the first active zone and the adjoining part of the semiconductor body, the first and second active zones with the underlying part of the semiconductor body forming the three active zones of a bipolar transistor.

A further important preferred embodiment is characterized in that one of the said active zones is formed by the monocrystalline portion of the part of the silicon layer which is situated within the window and shows the conductivity type of said active zone.

The invention furthermore relates to a method of manufacturing the device described, which device is characterized in that a silicon layer is provided at its surface with an electrically insulating layer, that at least a window is provided in said insulating layer, that a silicon layer is deposited from the gaseous phase on the insulating layer and on the silicon surface within the window, that at least a part of the silicon layer extending to within the window obtains a first conductivity type by a first doping process, that a further part of the silicon layer extending within a part of the window and on the insulating layer outside the window is then masked and that the non-masked further part of the silicon layer situated partly within the window and partly on the insulating layer outside the window is then converted by a second doping process into the second opposite conductivity type, the doped part of the silicon layer of the first conductivity type within the window contacting a zone of the first conductivity type adjoining the said surface.

Figure 2:
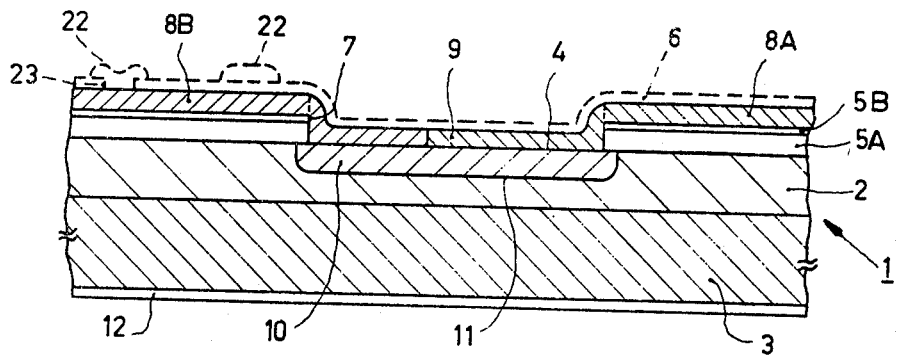
Figure 3:
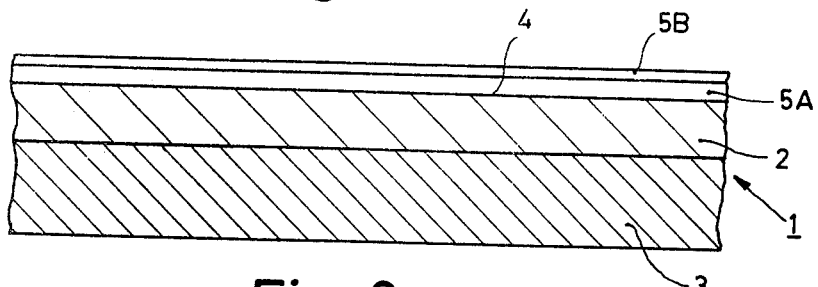
Figure 11:
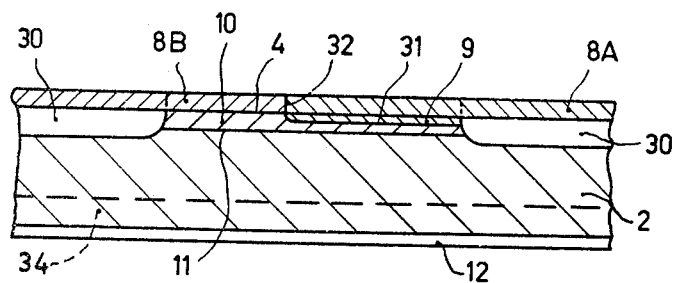
Figure 12:
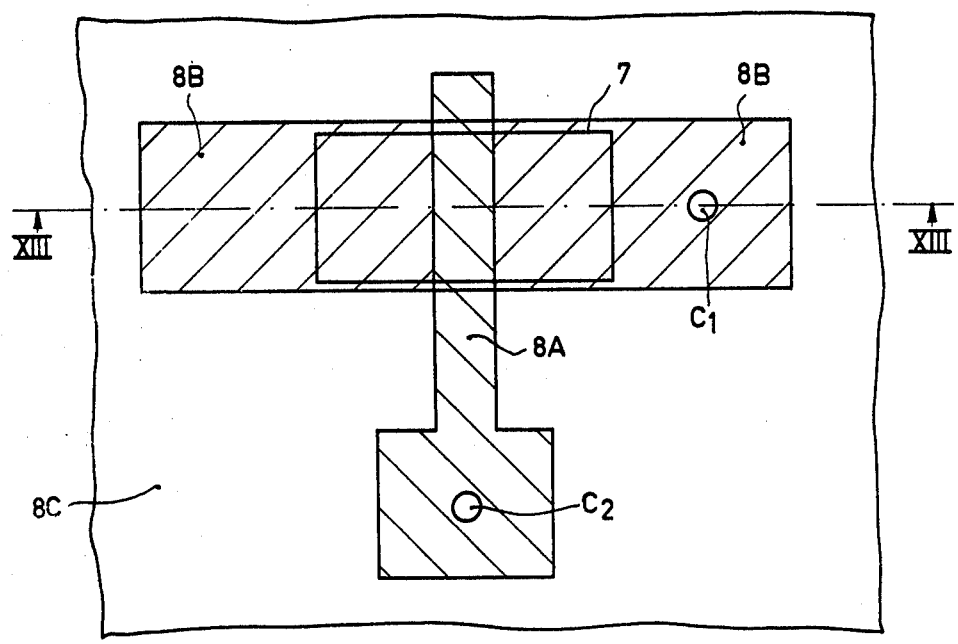
Figure 13:
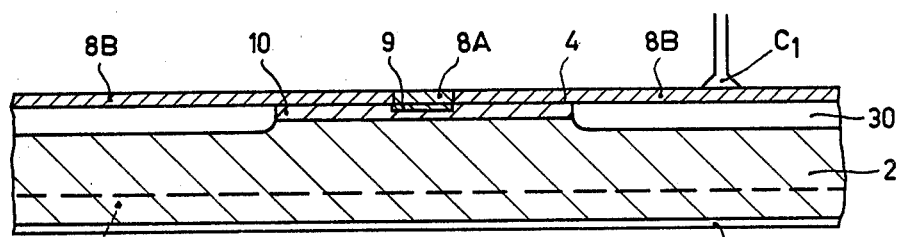
Figure 14:
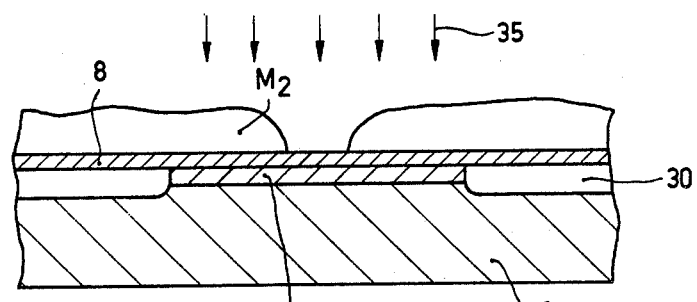
Figure 15:
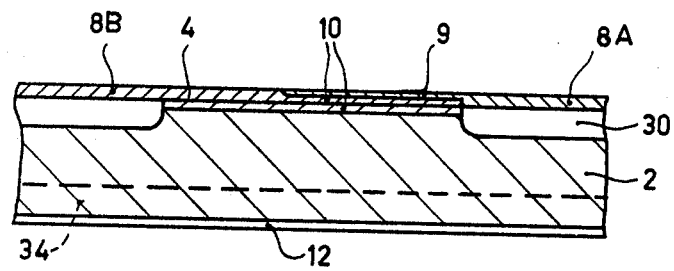
Figure 16:
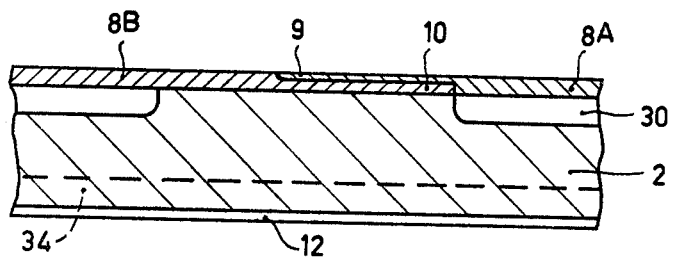
Figure 17:
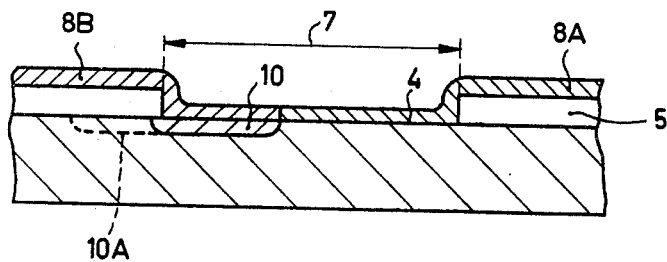

The invention will now be described in greater detail with reference to a few embodiments and the drawing, in which FIG. 1 is a diagrammatic plan view of a semiconductor device according to the invention, FIG. 2 is a diagrammatic cross-sectional view of the device shown in FIG. 1 taken on the line II—II, FIGS. 3 to 6 are diagrammatic cross-sectional views of the device shown in FIGS. 1 and 2 in successive stages of manufacture, FIGS. 7 to 11 are diagrammatic cross-sectional views of another device according to the invention in successive stages of manufacture, FIG. 12 is a diagrammatic plan view of a further device according to the invention, FIG. 13 is a diagrammatic cross-sectional view taken on the line XIII—XIII of the device shown in FIG. 12, FIG. 14 is a diagrammatic cross-sectional view of the device shown in FIGS. 12 and 13 in a stage of its manufacture, and FIGS. 15, 16 and 17 are diagrammatic cross-sectional views of other devices according to the invention.

The Figures are diagrammatic and not drawn to scale. In the cross-sectional views, regions of the same conductivity type are shaded in the same direction. Corresponding parts are generally referred to by the same reference numerals.

FIG. 1 is a plan view and FIG. 2 is a diagrammatic cross-sectional view taken on the line II—II of FIG. 1 of a semiconductor device according to the invention. The device has a semiconductor body 1 of monocrystalline silicon with a region of a first conductivity type, in this case formed by an n-type silicon layer 2, thickness for example 1.25 microns, resistivity approximately 1 Ohm.cm, which layer is provided on a supporting member 3 of, for example, highly doped n-type silicon having a resistivity of 0.01 Ohm.cm. The device comprises a semiconductor circuit element in the form of a bipolar transistor with emitter zone 9, base zone 10 and collector zone 2. A surface 4 of the semiconductor body has an electrically insulating layer 5, in this example consisting of a layer 5A of silicon oxide and a thin layer 5B of silicon nitride present thereon. A window 7 is present in the insulating layer 5 while there extends on the insulating layer 5 and on the silicon surface 4 a silicon layer 8 which comprises a first part 8A of the first conductivity type, so in this example n-type, and a second part 8B of the second conductivity type, so in this example p-type, adjoining same within the window 7.

According to the invention, the first portion 8A of the silicon layer forms within the window 7 the electrode and outside the window of the insulating layer 5 the connection conductor of a first active zone, here the emitter zone 9, of the first (n) conductivity type, and the second portion 8B of the silicon layer forms within the window 7 the electrode and outside the window 7 on the insulating layer 5 the connection conductor of a second active zone, here the base zone 10, of the second (p) conductivity type of the semiconductor circuit element, so in this case of the transistor (9, 10, 2). Within the window 7 the zone 10 adjoins the said surface 4 and forms a p-n junction 11 with the adjoining part of the region 2. The zone 10 substantially adjoins the edge of the window 7 and in this example is determined entirely by the window. In this example the silicon layer 8 within the window 7 consists of epitaxially grown monocrystalline material the boundaries of which within the layer 8 are denoted by broken lines. Outside the window 7 the layer 8 is polycrystalline. In certain circumstances, however, the layer 8 might also be polycrystalline within the window, which simplifies the manufacture since in that case the condition during providing the layer 8 are less critical. One of the active zones, namely the emitter zone 9, is formed in this example by the monocrystalline part of the portion 8A of the silicon layer 8 situated within the window 7 and having the same conductivity type as the zone 9. So in this case the base-emitter junction substantially coincides with the surface 4. However, this is by no means necessary and the emitter zone may alternatively extend below the surface 4 in the base zone 10, as will be demonstrated in the following examples. The collector zone 2 is contacted by means of an electrode layer 12 provided on the region 3.

In the example described the first active zone 9, the second active zone 10 and the adjoining n-type region 2 of the semiconductor body together form the three active zones, namely the emitter zone, base zone and collector zone of a bipolar transistor. Instead of bipolar transistors the device according to the invention may alternatively comprise quite different circuit elements, as will be described hereinafter. The second active zone 10 which in the above example is situated between the first active zone 9 and the region 2, may, for example, also be situated beside the first active zone.

Although in the above description the zone 9 is referred to as emitter zone and the region 2 is referred to as collector zone, the transistor may, of course, also be used in the reverse sense with zone 9 as collector zone and region 2 as emitter zone, which occurs, for example, in so-called I²L (="integrated injection logic") circuits.

It will be obvious that with the transistor described here a considerable space saving is obtained as compared with more conventional structures, inter alia because only one window is necessary. When, for example, the window 7 shows the minimum dimensions to be achieved by means of a certain technique, for example the usual photo-resist etching technique, at least two of these windows (emitter and base contact window) with inbetween an intermediate space determined by the necessary tolerance would be necessary for a planar transistor of conventional structure. Together with the part of the base zone extending around said windows, the base zone of the conventional transistor would thus occupy an area which is three to four times larger.

In the example described the silicon layer 8 extends over the whole surface of the body, in which the layer, outside the doped n-type parts 8A and p-type parts 8B (which also extend on the non-shown parts of the plate and may serve as interconnections), consists of non-doped portions 8C. This non-doped polycrystalline silicon has such a high resistivity, for example approximately 1000× higher, that it is substantially electrically insulating with respect to the doped parts. As a result of this no separate etching step to obtain a conductor pattern from the silicon layer 8 is necessary. If desired, however, the portions 8C of the layer 8 not serving as active zone, connection conductor, electrode or interconnection, may be etched away entirely or partly, for example when the resulting undoped silicon does not show the necessary high resistivity.

The semiconductor device described can be manufactured according to the invention as follows. It is to be noted that, of course, many hundreds of transistors can be manufactured simultaneously on the same semiconductor slice while the transistor may also form part of an integrated circuit. The transistors or the integrated circuits which are manufactured on the same silicon substrate are then severed after the manufacture, for example, by scratching and breaking. For simplicity, however, the manufacture of only one transistor will be described with reference to FIGS. 3 to 6.

Starting material (see FIG. 3) is a monocrystalline silicon body 1 which is built up from an n-type supporting member 3 having a resistivity of 0.01 Ohm.cm and an n-type silicon layer 2 which is grown thereon epitaxially and has a resistivity of 1 Ohm.cm and a thickness of 1.25 microns. This body 1 is provided at its surface 4 with an electrically insulating layer. For this purpose, for example, a thermal oxidation at 1100° C. for approximately 30 minutes may be carried out in moist oxygen so that a silicon oxide layer 5A, thickness approximately 0.3 micron, is obtained. A layer 5B of silicon nitride, thickness approximately 0.1 micron, is provided on said layer in this example in known manner by deposition from an atmosphere containing $NH_3$ and $SiH_4$ at 1000° C.

Figure 4:
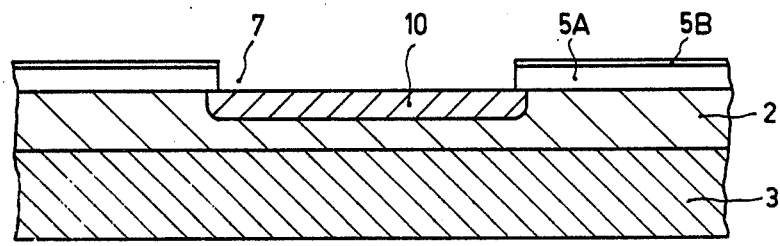

By means of known photolithographic etching methods, a window 7 having dimensions of, for example, 5 microns × 10 microns, is provided in the composite insulating layer (5A, B), see FIG. 4. For etching the nitride, a thin oxide mask defined by photoresist may be provided on the nitride layer 5B; the etching of the silicon nitride may be carried out in hot phosphoric acid. By diffusion of, for example, boron, a p-type zone 10 whose edges are determined by the window is diffused via the window; the layer 5 masks against said doping.

Figure 5:
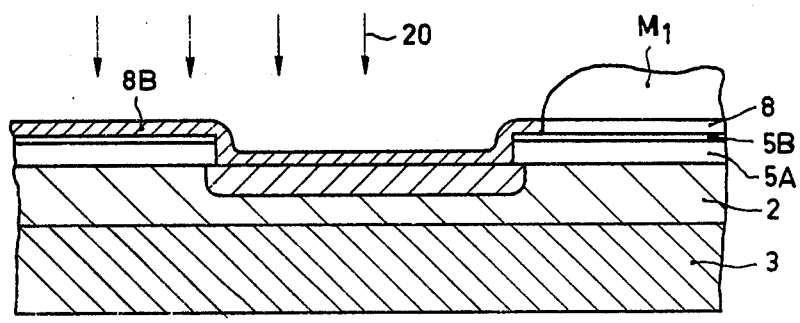

A silicon layer 8 is now deposited from the gaseous phase on the insulating layer 5 and on the silicon surface 4 within the window 7, see FIG. 5. This is done, for example, from an $SiH_4$-atmosphere at approximately 1020° C., as described in the above-mentioned U.S. Pat. No. 3,600,651, column 2, lines 37 to 48. As a result of this, an undoped epitaxial monocrystalline layer is formed within the window 7 and an undoped polycrystalline layer, thickness approximately 1 micron, is formed on the insulating layer outside the window. When the layer 8 may also be polycrystalline within the window, lower growth temperatures may also be used, for example, approximately 900° C.

Figure 5A:
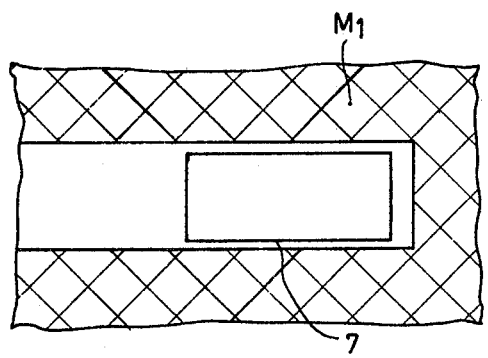

A first portion 8B of the silicon layer 8 which extends into the window 7 is now strongly p-type doped by a first doping process, for example by implantation of boron ions in the direction of the arrows 20 (sheet resistance approximately 200 Ohm per square). A photoresist mask M1 (see also the plan view of FIG. 5a; M1 shaded) masks against said implantation; the silicon layer 8 remains high-ohmic below the mask M1. In certain circumstances, for example, when a conductor pattern is etched afterwards from the silicon layer 8, the mask M1 may be omitted.

Figure 6:
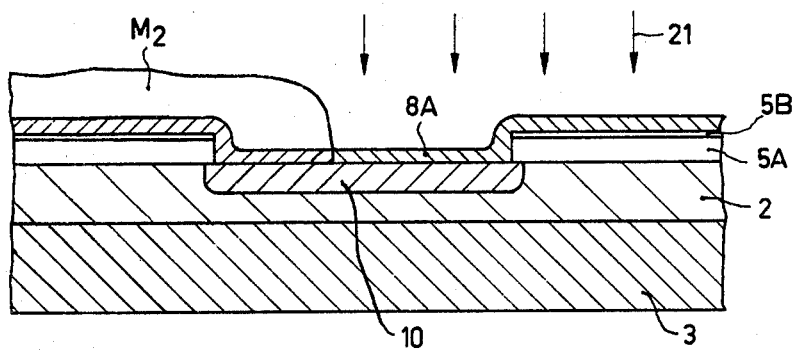
Figure 6A:
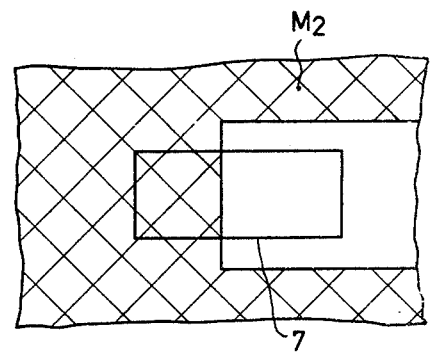
Figure 7:
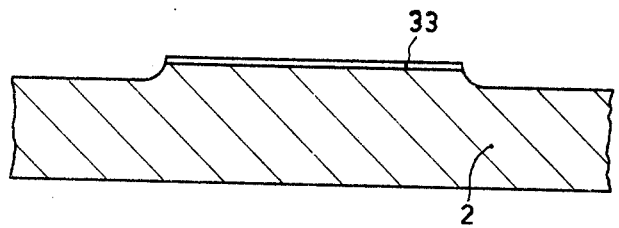

After removing the mask M1 a further portion of the silicon layer 8 extending within a part of the window 7 and on the insulating layer 5 is masked, for example by means of a photoresist mask M2, see FIG. 6 and the associated plan view FIG. 6a. The non-masked portion 8A of the silicon layer 8 present partly within the window 7 and partly on the insulating layer 5 outside the window 7 is then converted into highly doped n-type silicon having a sheet resistance of approximately 10 Ohm per square by means of a second doping process, for example by an implantation of phosphorus ions in the direction of the arrows 21. The earlier doped p-type conductive portion 8B of the silicon layer within the window contacts the p-type conductive zone 10 adjoining the surface 4. After providing an electrode layer, for example a gold layer 12, on the region 3, the structure shown in FIGS. 1 and 2 is obtained. Connection contacts may be provided on the polycrystalline layer portions 8A and 8B, or said layer portions may be connected to circuit elements present elsewhere on the silicon plate. If desired, the layer 8 may be covered with a layer 6 of oxide or glass on which a second metallization 22 is provided which, if necessary, is locally connected via windows 23 in the said glass layer to the layer portions 8A and 8B (shown in broken lines in FIG. 2).

FIGS. 7 to 11 are diagrammatic cross-sectional views of another embodiment of the transistor shown in FIGS. 1 and 2 in successive stages of its manufacture. For simplicity, the starting material is a single n-type silicon body 2; it will be obvious that in this example also the region 2 may be an epitaxial layer grown on a supporting member. As an insulating layer is used in this example a silicon oxide layer 30 which is sunk in the region 2 and which is obtained by selective oxidation, see FIG. 11. Furthermore, the first n-type active zone 9 (the emitter zone) and the second p-type active zone 10 in this example constitute a p-n junction (31, 32) with each other on which a part 31 extends in the semiconductor body and a part 32 extends in the silicon layer 8, the parts 31 and 32 of the p-n junction merging into each other at the area of the surface 4 and thus constituting an uninterrupted continuous p-n junction. The silicon layer at least within the window is preferably monocrystalline. The silicon layer may also be entirely polycrystalline in which, however, annoying leakage currents might occur via the parts 32 of the p-n junction. The plan view of this embodiment may, for example, be equal to that of FIG. 1. Corresponding parts of the figure have the same reference numerals in FIGS. 1 to 6 and in FIGs. 7 to 11.

Figure 8:
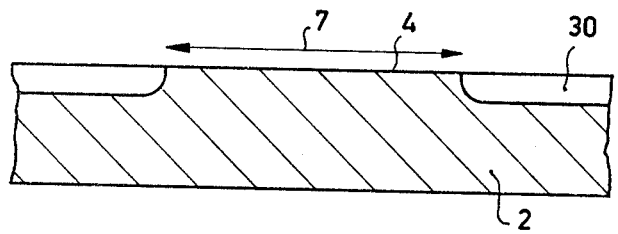
Figure 9:
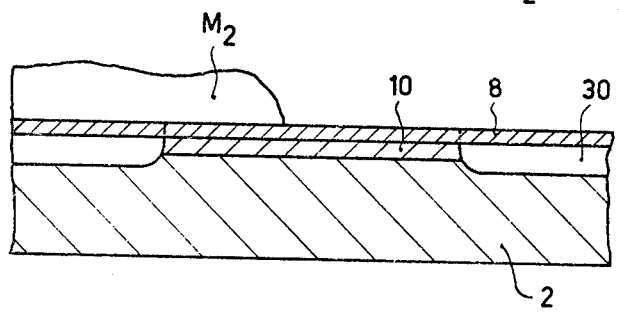
Figure 10:
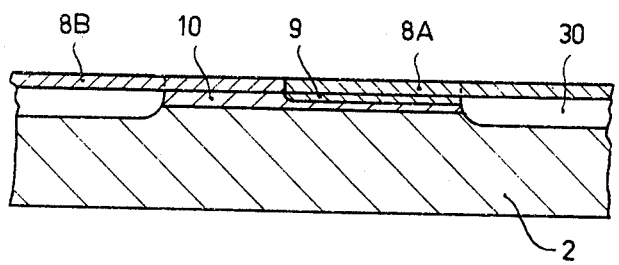

For the manufacture of this device, a layer 33 masking against etching and against oxidation, for example a silicon nitride layer or a combined oxide-nitride layer, is provided in the usual manner on the surface of the region 2. A portion of the layer 8 with the size of the window 7 to be formed (FIG. 8), is covered with an etching mask and the non-masked part of the silicon body is etched away over a depth of approximately 1 micron, the structure of FIG. 7 being obtained. The sunken oxide layer 30 is then obtained by heating in an oxidizing atmosphere with an overall thickness of approximately 2 microns, of which the surface coincides substantially with the silicon surface 4 which is protected against oxidation by the masking layer 33. After removing the layer 33 the structure shown in FIG. 8 is obtained. For all details regarding the formation of a sunken oxide layer by selective oxidation, and the etching of oxide layers and nitride layers, reference is invited to Appels et al, Philips Research Reports 25 (1970) pp. 118–132, where all the information necessary to those skilled in the art is to be found.

In the same manner as in the preceding example, a silicon layer 8 is then deposited on the surface, for example, in such manner that the part of the layer 8 not situated on the insulating layer 30, within the window 7, grows monocrystalline, while the part situated on the oxide 30 is polycrystalline. The silicon layer 8 is then doped, at least within the window in the oxide layer 30 and on a part of the oxide layer, with, for example, boron until a high p+ conductivity is achieved. In the cross-sectional view shown in FIG. 9 the whole layer 8 is made p+ conductive. Using the layer 8 as a source, boron is diffused in the region 2 at high temperature (for example approximately 1050°) to form the p-type base zone 10, after which a photoresist mask M2 is provided which extends over a part of the window 7, see FIG. 9. By implantation of phosphorus ions, the mask M2 masking against said implantation, the non-masked portion 8A of the silicon layer 8 is converted into highly doped n-type silicon, said portion 8A adjoining the masked p+ type portion 8B of the silicon layer 8. At elevated temperature (and after removing the mask M2) some of the phosphorus atoms are then diffused out of the portion 8A of the silicon layer 8 in the p-type zone 10 so as to form the emitter zone 9, see FIG. 10. After providing an electrode layer 12 and etching away the undoped portions 8C of the layer 8 (see FIG. 1) the transistor structure shown in FIG. 11 is obtained. The diffusion temperatures and times, as well as the other variables of the manufacturing process can be varied within wide limits by those skilled in the art and be adapted to the desired values of base thickness, emitter thickness, and so on, according to methods conventionally used in semiconductor technology. In order to obtain a low-ohmic contact, a highly doped n-type layer 34 may be provided, if desired, between the electrode layer 12 and the n-type region 2, for example a diffused layer (see FIG. 11).

A further modified embodiment of the semiconductor device according to the invention and of the method of manufacturing same will now be described with reference to FIGS. 12 to 14. FIG. 12 is a plan view of the device and FIG. 13 is a diagrammatic cross-sectional view taken on the line XIII—XIII of FIG. 12. This device is distinguished from the device shown in FIG. 11 mainly in that the active zone 9 is provided by doping a narrow stripe-shaped portion 8A of the silicon layer 8. The advantage of this is that the dimensions of the active zone 9 are substantially constant also when the stripe 8A shows a certain shift with respect to the window 7, at least so long as it is situated within the window with its entire width. As a result of this the active zone 9 has the shape of a narrow stripe which at the surface 4 is bounded by the active zone 10 within the window 7 on both sides. The reproducibility of the device is thus particularly good. FIG. 14 illustrates the formation of the stripe-shaped zone by implantation of, for example, phoshorus or arsenic ions (arrows 35) via a slot-shaped photoresist mask (M2); if desired, the doping may be effected by diffusion when, instead of a photoresist mask, a mask is used of, for example, silicon oxide or silicon nitride. The other operations may be carried out analogously to those of the preceding examples. The base and emitter zones may be contacted, for example, on the contact pads $C_1$ and $C_2$. In this case also, a double metallization is possible, if desired, as described with reference to FIG. 2.

FIGS. 15, 16 and 17 finally show, by way of example, diagrammatic cross-sectional views of a few other embodiments of the device according to the invention from which it can be appreciated that the invention is not restricted to bipolar transistors. FIG. 15 shows a device in which the n-type zone 9 is present in the monocrystalline region of the silicon 8 within the window but does not extend there throughout the thickness of the layer 8. Within the window is situated the p-type base zone 10, between the n-type zone 9 and the n-type region 2, partly in the silicon layer 8 and partly below the surface 4. Such a device can be manufactured comparatively simply due to the fact that doping atoms diffuse considerably more rapidly in polycrystalline material than in monocrystalline material. As a result of this, for example by first doping only the uppermost surface layer of the silicon layer 8 by implantation with, for example, phosphorus ions and then carrying out a suitable heating, the phosphorus can be diffused simultaneously throughout the layer of the polycrystalline silicon on the oxide layer 30 and only over a part of the thickness of the monocrystalline silicon layer 8 within the window.

FIG. 16 shows an example of the case in which in FIG. 15 the zone 10 is present exclusively in the layer 8, and FIG. 17 shows a diode of which the p-type region 10 extends in the body below the surface 4, the n-type portion 8A of the silicon layer serving as a connection conductor and a contact electrode on the n-type region 2, and the p-type portion 8B serving as a connection conductor and a contact electrode on the zone 10. The zone 10 extends only over a part of the window 7 and is only partly determined by the edge of the window. In certain circumstances the zone 10 is even not at all determined by the edge of the window 7 as denoted by the broken line 10A in FIG. 17. In the device shown in FIG. 17 the silicon layer 8 may also be polycrystalline within the window 7.

It will be obvious that the invention is not restricted to the examples described. For example, the conductivity types in the examples may be reversed and any other doping method may be used for the various dopings in addition to those mentioned. For example, instead of ion implantation, diffusion, for example from the gaseous phase or from doped oxide or glass may be used, or conversely. The doping atoms or ions mentioned may also be replaced by other atoms or ions. The region 2 may be provided as an epitaxial layer on any substrate. In FIG. 2, for example, the substrate 3 may be p-type conductive instead of n-type, and so be oppositely doped with respect to the layer 2. In that case the region 2 should, of course, at the surface 4 be contacted elsewhere on the plate via an aperture somewhere in the portion 8C of the layer 8. The substrate may alternatively consist, for example, of sapphire on which the layer 2 is grown epitaxially. Furthermore, the semiconductor device may comprise several windows in the insulating layer (5, 30) instead of one window. All the devices described may be used in combination with other semiconductor elements in an integrated circuit (which may or may not be monolithic).

Finally it is to be noted that the expression "polycrystalline silicon" has been used here in a wide meaning so as to indicate non-monocrystalline silicon and hence also comprises, for example, amorphous silicon.

What is claimed is:

1. A method of manufacturing a semiconductor device having a semiconductor body of monocrystalline silicon, which comprises:
    providing an electrically insulating layer on the surface of said silicon semiconductor body;
    providing a window in said insulating layer to expose a portion of the silicon body surface;

forming a surface zone of a first type conductivity at least partly adjacent the surface-adjoining portion of the silicon body exposed by said window;

depositing a silicon layer from the gaseous phase on the insulating layer and on the exposed silicon surface within said window;

doping at least a part of the silicon layer within said window in a first doping step to obtain a first silicon lower part of the first type conductivity, the first silicon layer part within the window contacting said surface zone of the first type conductivity;

masking a part of the silicon layer extending within a part of the window and on the insulating layer outside the window; and converting a further nonmasked part of the silicon layer situated partly within the window and partly on the insulating layer outside the window to a second type conductivity opposite to that of the first type in a second doping step to obtain a second silicon layer part of the second type conductivity, said second silicon layer part being formed adjoining the first silicon layer part at least within said window.

2. A method as claimed in claim 1, wherein the silicon layer is deposited epitaxially to form a monocrystalline layer within the window.

3. A method as claimed in claim 1, wherein the first doping step is carried out during the deposition of the silicon layer.

4. A method as claimed in claim 1, wherein at least the second doping step comprises an ion implantation step.

5. A method as claimed in claim 1, wherein the surface zone of the first conductivity type is formed by diffusion from the silicon layer prior to the second doping step.

6. A method as claimed in claim 1, wherein the surface zone of the first conductivity type is formed in the silicon body before the silicon layer is deposited and by a doping process in which the insulating layer is used as a mask.

7. A method as claimed in claim 1, wherein prior to the first doping step the silicon layer is masked against doping except at said part of the silicon layer to be doped in the first doping step, and wherein the remaining, undoped, high-resistivity parts of the silicon layer are not subsequently removed.

8. A method as claimed in claim 1, wherein said semiconductor body of monocrystalline silicon is of said second type conductivity, and wherein said surface zone forms a p-n junction with the adjacent surface-adjoining portion of said silicon body.

* * * * *

UNITED STATES PATENT AND TRADEMARK OFFICE
CERTIFICATE OF CORRECTION

PATENT NO. : 4,283,837
DATED : August 18, 1981
INVENTOR(S) : Arie Slob

It is certified that error appears in the above—identified patent and that said Letters Patent is hereby corrected as shown below:

Col. 9, line 9, change "lower" to

--layer--

Signed and Sealed this

Ninth Day of November 1982

[SEAL]

Attest:

Attesting Officer

GERALD J. MOSSINGHOFF
Commissioner of Patents and Trademarks